(12) United States Patent
Karbing et al.

(10) Patent No.: US 11,864,528 B2
(45) Date of Patent: Jan. 9, 2024

(54) CONTROL MODULE, AND A CONTROL ARRANGEMENT FOR A MILKING PLANT

(71) Applicant: DELAVAL HOLDING AB, Tumba (SE)

(72) Inventors: Emil Karbing, Tumba (SE); Anders Kvist, Tumba (SE); Ingvar Sjökvist, Tumba (SE)

(73) Assignee: DeLaval Holding AB, Tumba (SE)

(*) Notice: Subject to any disclaimer, the term of this patent is extended or adjusted under 35 U.S.C. 154(b) by 425 days.

(21) Appl. No.: 17/292,364

(22) PCT Filed: Nov. 8, 2019

(86) PCT No.: PCT/SE2019/051127
§ 371 (c)(1),
(2) Date: May 7, 2021

(87) PCT Pub. No.: WO2020/096517
PCT Pub. Date: May 14, 2020

(65) Prior Publication Data
US 2022/0000064 A1    Jan. 6, 2022

(30) Foreign Application Priority Data
Nov. 8, 2018   (SE) .................................... 1800215-4

(51) Int. Cl.
*H05K 5/00*    (2006.01)
*A01J 5/007*   (2006.01)
*H05K 5/02*    (2006.01)

(52) U.S. Cl.
CPC ............ *A01J 5/007* (2013.01); *H05K 5/0017* (2013.01); *H05K 5/0026* (2013.01); *H05K 5/0247* (2013.01)

(58) Field of Classification Search
CPC combination set(s) only.
See application file for complete search history.

(56) References Cited

U.S. PATENT DOCUMENTS

| 4,922,855 | A | * | 5/1990 | Tomizawa | .............. | A01J 5/007 |
| | | | | | | 119/14.08 |
| 6,307,749 | B1 | | 10/2001 | Daanen et al. | | |

(Continued)

FOREIGN PATENT DOCUMENTS

| CN | 101313641 A | 11/2008 |
| CN | 102105335 A | 6/2011 |

(Continued)

OTHER PUBLICATIONS

Office Action issued in Chinese Patent Application No. 201980073806.4 dated Jul. 19, 2022.

(Continued)

*Primary Examiner* — Lisa Lea-Edmonds
(74) *Attorney, Agent, or Firm* — NIXON & VANDERHYE

(57) ABSTRACT

A control arrangement and a control module for a milking position for milking a dairy animal includes a casing forming an inner space enclosing a printed circuit board incorporating a control system for controlling and supervising at least some functions of the milking position. A communication area is provided on a front side of the printed circuit board and communicates with the control system. The casing includes an inner front plate. The front side of the printed circuit board is attached to a rear side of the inner front plate by a transparent adhering substance so that a part of the printed circuit board projects from the rear side of the inner front plate. The inner front plate permits access to the communication area. The part of the printed circuit board is embedded in a block of plastic material.

21 Claims, 8 Drawing Sheets

(56) References Cited

U.S. PATENT DOCUMENTS

| | | | | |
|---|---|---|---|---|
| 7,710,714 | B2* | 5/2010 | Rapp | G01G 21/283 |
| | | | | 361/679.01 |
| 10,085,411 | B2* | 10/2018 | Johansson | A01J 5/12 |
| 2002/0045970 | A1* | 4/2002 | Krause | G05B 19/0426 |
| | | | | 700/264 |
| 2003/0130808 | A1* | 7/2003 | Kapitulskiy | G01F 1/52 |
| | | | | 702/45 |
| 2004/0012936 | A1 | 1/2004 | Gravelin | |
| 2004/0025606 | A1* | 2/2004 | Veenstra | A01J 7/027 |
| | | | | 119/14.08 |
| 2005/0199737 | A1 | 9/2005 | De Pauw et al. | |
| 2007/0289536 | A1* | 12/2007 | Dunn | A01J 5/0138 |
| | | | | 119/14.14 |
| 2008/0066685 | A1* | 3/2008 | Rysewyk | A01J 5/0138 |
| | | | | 119/14.14 |
| 2008/0202431 | A1* | 8/2008 | Obermuller | H05K 5/00 |
| | | | | 119/14.03 |
| 2012/0040541 | A1 | 2/2012 | Liskow | |
| 2013/0199449 | A1* | 8/2013 | Daniel | A01J 5/007 |
| | | | | 119/14.08 |
| 2014/0285987 | A1* | 9/2014 | Nagashima | B60T 8/368 |
| | | | | 361/759 |
| 2014/0319233 | A1 | 10/2014 | Novotny et al. | |
| 2015/0366076 | A1 | 12/2015 | Colwell | |
| 2016/0149355 | A1 | 5/2016 | Yeom | |
| 2016/0306482 | A1 | 10/2016 | Gmyr et al. | |
| 2018/0235099 | A1 | 8/2018 | Dane et al. | |
| 2020/0275633 | A1* | 9/2020 | McDougal | A01J 7/00 |

FOREIGN PATENT DOCUMENTS

| | | |
|---|---|---|
| CN | 203339219 U | 12/2013 |
| CN | 204189391 U | 3/2015 |
| CN | 204335503 | 5/2015 |
| CN | 205644162 | 10/2016 |
| EP | 1 635 154 | 3/2006 |
| JP | 2010-266117 | 11/2010 |
| WO | 2006/068589 | 6/2006 |
| WO | 2008/051134 | 5/2008 |
| WO | 2018/044159 | 3/2018 |

OTHER PUBLICATIONS

International Search Report for PCT/SE2019/051127 dated Feb. 10, 2020, 4 pages.
Written Opinion of the ISA for PCT/SE2019/051127 dated Feb. 10, 2020, 7 pages, with English Translation.
SE Search Report for SE 1800215-4 dated Apr. 15, 2019, 2 pages.

* cited by examiner

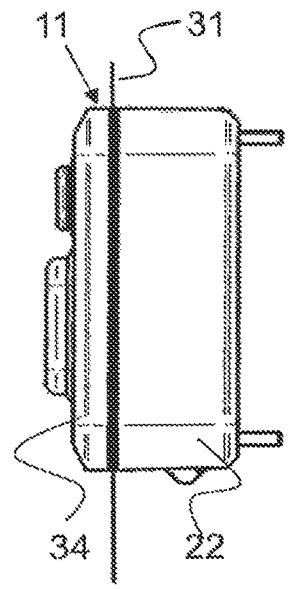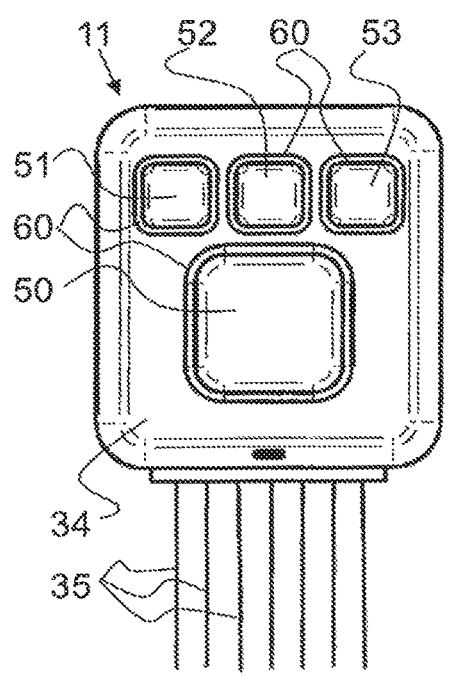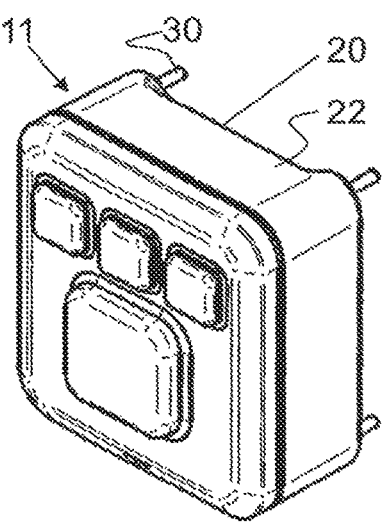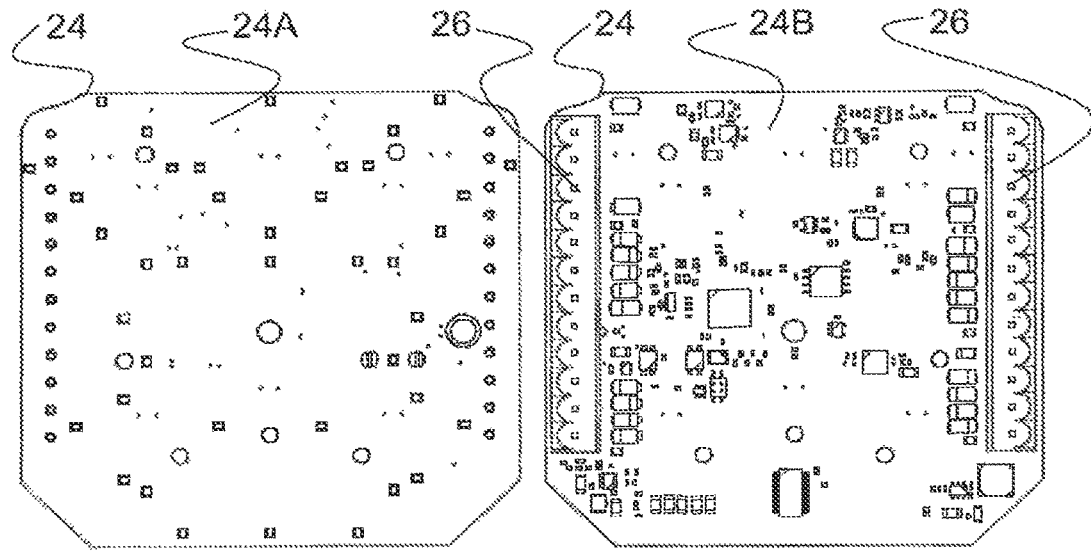

CONTROL MODULE, AND A CONTROL ARRANGEMENT FOR A MILKING PLANT

CROSS-REFERENCE TO RELATED APPLICATIONS

This application is the U.S. national phase of International Application No. PCT/SE2019/051127 filed Nov. 8, 2019 which designated the U.S. and claims priority to SE Patent Application No. 1800215-4 filed Nov. 8, 2018, the entire contents of each of which are hereby incorporated by reference.

TECHNICAL FIELD OF THE INVENTION

The present invention refers generally to a control module for a milking position and to a control arrangement for a milking plant. More specifically, and according to the preamble of claim 1, the present invention refers to a control module for controlling and supervising various functions of a milking position for milking a respective dairy animal.

The present invention also refers to a control arrangement forming an overall control system for controlling and supervising various functions of a milking plant incorporating a plurality of milking positions for milking a respective dairy animal.

BACKGROUND OF THE INVENTION AND PRIOR ART

Known control arrangements for milking plants require fairly extensive installation work in order to be properly adapted to the specific requirements of the milking plant and to various preferences of the individual farmer. For instance, the known control arrangements are not always well adapted to milking plants of different sizes and kinds, and not to the various functions to be controlled and supervised at each milking position of a milking plant. In particular, known control arrangements may not in an easy manner permit addition of further control and supervising functions once they have been installed, or conversely, they may contain more control and supervising functions than demanded by the farmer.

Another problem of the known control arrangements is related to the fact that the milking plants constitute a very difficult environment for electronic control equipment. Humidity and various harmful substances may circulate in the air in the milking plant and may deteriorate the reliability and the functioning of the electronic equipment of the control arrangement.

Another problem of the known control arrangements is that it is difficult to locate them in an ergonomic position for the staff performing the milking. A position which is suitable for e.g. pushing buttons is not necessarily suitable for e.g. viewing and reading instructions/feedback, and vice versa.

WO 2008/051134 discloses an arrangement provided in a milking system for simultaneous milking of a plurality of animals, wherein the milking system comprises a plurality of milking positions and an arrangement for establishing identities of and expected milking times for the animals. Each of the milking positions is provided with teatcups, which are attached to the teats of an animal and are connected to a source of vacuum for milking the animal. The arrangement comprises means for determining a milking position, at which the animal having the longest expected milking time is present, based on the established identities and expected milking times, and a device for performing an action with respect to the milking system in response to the determination.

WO 2006/068589 refers to a compact modular unit to be mounted in a milking stall comprising at least one pipeline system, which provides an operative function in connection with a milking process of an animal in the milking stall. The compact modular unit comprises a casing, which defines an inner space of the compact modular unit, an electric control unit, which is mounted in said inner space of the compact modular unit, and indication means, which are arranged to display information related to the milking processes in the milking stall. Furthermore, the compact modular unit comprises a component of the pipeline system, which is mounted in the inner space of the compact modular unit.

SUMMARY OF THE INVENTION

The purpose of the present invention is to provide a solution to the problems discussed above, and more precisely to provide improved means for controlling and supervising a milking position of a milking plant, and for controlling and supervising a milking plant comprising a plurality of milking position.

This purpose is achieved by the control module initially defined, which is characterized in that the casing comprises an inner front plate, that the front side of the printed circuit is attached to a rear side of the inner front plate by means of a transparent adhering substance, for instance a transparent glue, so that at least a the part of the printed circuit board projects from the rear side of the inner front plate, that the inner front casing plate permits access to the communication area through the inner front plate, and that said part of the printed circuit board is embedded in a block of plastic material.

By enclosing the printed circuit board of the control module in the block of plastic material, the transparent adhering substance and the inner front plate, and in the casing, the resistance to humidity and harmful substances of the environment may be enhanced. Especially, by the enclosing of the printed circuit board and the connections against the environment, the control module may withstand the washing procedure of the milking position when water, or any other washing liquid, is sprayed onto the equipment, including the control module, frequently under high pressure. The block of plastic material provides a good protection to the printed circuit board inside the casing, even if humidity and any harmful substance would reach the inner space of the casing. The plastic material may comprise or consist of polyurethane.

According to an embodiment of the invention, the functions comprise at least one of the following functions: milk meter supervision, pulsator rate control and supervision, vacuum shut-off of milking vacuum, retraction of milking cluster, spraying disinfectant, initiating start of milking operation, opening and closing of gates, etc.

According to an embodiment of the invention, the casing comprises an outer rear casing that together with the inner front plate encloses the inner space.

According to an embodiment of the invention, the outer rear casing and the inner front plate are assembled along a respective edge to form the inner space. A gasket may be provided between the edges of the outer rear casing and the inner front plate.

According to an embodiment of the invention, wherein the input and output connections extend from the printed circuit board, or from the rear side of the printed circuit board, through and beyond the block of plastic material. The input and output connections may be enclosed in the casing.

According to an embodiment of the invention, the communication area comprises a contact surface and a light emitting surface, wherein light emitted by the light emitting surface is visible from outside the casing. The communication area is accessible through the inner front plate and the transparent adhering substance.

According to an embodiment of the invention, the light emitting surface emits different light signals for indicating various states of some of the functions. These states may include, for instance, a full milk flow, washing is ongoing, a waiting state, a standby state, an alarm etc. The different light signals may include light of different colors, flashing light, circulating light, light moving back and forth etc.

According to an embodiment of the invention, the control module comprises at least one button, which is accessible from outside the casing and acts on the contact surface for initiating and/or interrupting one of the functions via the electric lines. For instance, by activating the button, start of the milking operation may be initiated, or the milking vacuum may be shut-off and retraction of the milking cluster initiated.

According to an embodiment of the invention, one or more further buttons, accessible from outside the casing and acting on the contact surface, may be provided for selecting the function to be initiated and/or interrupted by said button.

According to an embodiment of the invention, the control module comprises a display, which is visible from outside the casing and is connected to the contact surface of the communication area for displaying a state of some of the functions.

According to an embodiment of the invention, the inner front plate comprises at least one light guide, which is transparent to the light emitted by the light emitting surface and provided opposite to the light emitting surface.

According to an embodiment of the invention, the inner front plate comprises an aperture giving access to the contact surface.

According to an embodiment of the invention, the light guide surrounds the aperture. The light guide may thus surround the button, so that a ring of different light signals may be formed around the button.

According to an embodiment of the invention, the block of plastic material is enclosed in an inner casing formed by an inner rear casing and the inner front plate, wherein the inner rear casing is enclosed in the casing. Such an inner casing further improves the protection against the environment of the milking plant, and during the above-mentioned washing procedure.

According to an embodiment of the invention, the casing may comprise one or more venting holes to permit gases and liquids to escape from the inner space between the inner casing and the casing. This is advantageous, especially during the above-mentioned washing procedure.

According to an embodiment of the invention, an outer front plate is attached to the inner front plate and comprises an opening providing access to the communication area.

According to an embodiment of the invention, the button extends through the opening, and wherein the outer front plate comprises a light zone that surrounds the opening, is transparent to the light emitted by the light emitting surface, and is provided opposite to the light emitting surface.

According to an embodiment of the invention, the electric lines are grouped in at least two cables, for instance two, three, four, five, six, etc. cables. Such pre-prepared cables are easy to install and may contribute to a more efficient installation of the control arrangement. Each cable may comprise an insulation, or a tight insulation, enclosing the respective electric lines, especially a large number of electric lines running within the insulation of each cable. In other words, the control module is adapted to receive a plurality of cables, each comprising a plurality of electric lines, to which the module is connectable.

According to an embodiment of the invention, a cable clamp is provided in the casing and comprises a first clamp part and a second clamp part, wherein the first and second clamp parts form a respective cable channel for each of said at least two cables.

According to an embodiment of the invention, the cable clamp is provided between the inner rear casing and the inner front plate. The cable clamp my thus be located at least partly in the inner space. A recess may be provided in the inner rear casing permitting the cables to pass therethrough.

According to an embodiment of the invention, each of the cable channels has a curved extension forming a curved, or bent, path for the respective cable. Such curved extension may contribute to a firm and tight engagement of the cables in the cable clamp, and may prevent water from entering via the cable channel.

The purpose is also achieved by the control arrangement initially defined, wherein the first control module comprises a control module as described above and wherein the printed circuit board incorporates at least a first part of the control system for controlling and supervising at least some of the functions.

According to an embodiment of the invention, the control arrangement comprises a respective second control module for each of the milking positions, wherein the second control module comprises a control module as described above, wherein the printed circuit board incorporates at least a second part of the control system for controlling and supervising at least some of the functions.

Thanks to the second control module, the flexibility of the control arrangement is improved. In each individual milking position, the farmer may choose to install one or more control modules in the milking position depending on the control and supervising needs.

Thanks to the second control module, or even further control modules, it is, in case of a defect control module, only necessary to repair or replace the defect control module. The costs for repair and maintenance may be reduced.

According to an embodiment of the invention, the first part of the control system and the second part of the control system are overlapping, or at least partly overlapping, wherein the first part of the control system and the second part of the control system at least partly cover the same functions. Possibly, the first part and the second part of the control system may be identical, although different functions may be activated in the different parts. This means that the control system may have a redundant functionality and be configured to operate unaffected, at least temporarily, even if one of the control modules is defect. The defect control module may be repaired or replaced without the need to shut down the control system. Consequently, the costs for repair and maintenance may be reduced.

In particular, the printed circuit board of the control modules may be identical, or substantially identical.

According to an embodiment of the invention, the control arrangement comprises a respective third control module for at least some of the milking positions, wherein the third control module comprises a control module as described above, and wherein the printed circuit board, incorporating at least a third part of the control system for controlling and supervising at least some of the functions. The third control module may be configured for controlling the function of for example the opening and closing of the gates. The third control module may alternatively, or in addition, have the function of a router, handling the communication between modules, mounted in a number of milking positions (e.g. first and/or second modules), and other functions or equipment, such as e.g. a herd management system. One third control module may serve a plurality of milking positions, e.g. 5-50 milking positions.

By introducing a third module the flexibility of the control arrangement is further enhanced.

According to an embodiment of the invention, the first part of the control system, the second part of the control system and the third part of the control system are overlapping, or at least partly overlapping, and wherein the first part of the control system, the second part of the control system, and the third part of the control system at least partly cover the same functions. Possibly, the first part, the second part and the third part of the control system may be identical.

In particular, the printed circuit board of the first, second and third modules may be identical, or substantially identical.

According to an embodiment of the invention, a display is provided on the casing of the second module, wherein the display is connected to the communication area and arranged for displaying a state of some of the functions. A display may also be provided on the casing of the first module and/or third module.

BRIEF DESCRIPTION OF THE DRAWINGS

The present invention is now to be explained more closely by the description of various embodiments and with reference to the drawings attached hereto.

FIG. 3 discloses schematically a side view of a first control module of a control arrangement for controlling and supervising various functions of the milking plant in FIG. 1.

FIG. 4 discloses schematically a front view of the first control module in FIG. 3.

FIG. 5 discloses schematically a perspective view of the first control module in FIG. 3.

FIG. 6 discloses a front view a printed circuit board of the first control module.

FIG. 7 discloses a rear view the printed circuit board in FIG. 6.

DETAILED DESCRIPTION OF VARIOUS EMBODIMENTS

Figure 1:
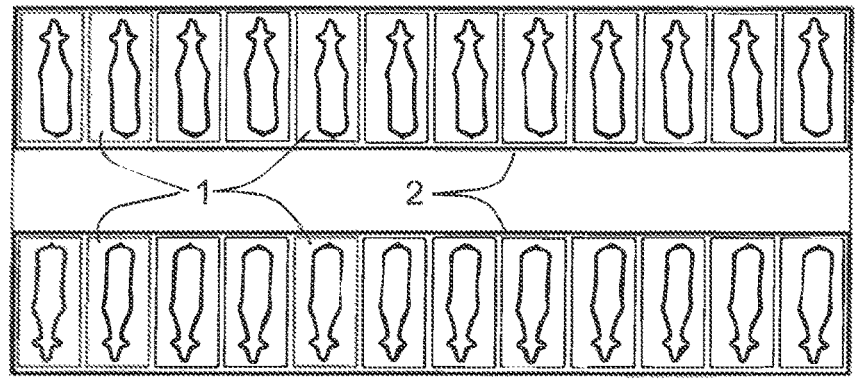
FIG. 1 discloses schematically a view from above of a milking plant.

FIG. 1 discloses a milking plant comprising a plurality of milking positions 1. Each milking position 1 is configured to house a diary animal. Each milking position 1 or a group of milking positions 1 may be delimited by floor 1A, and a bar and gate structure 2 which may comprise an openable gate 3.

Figure 2:
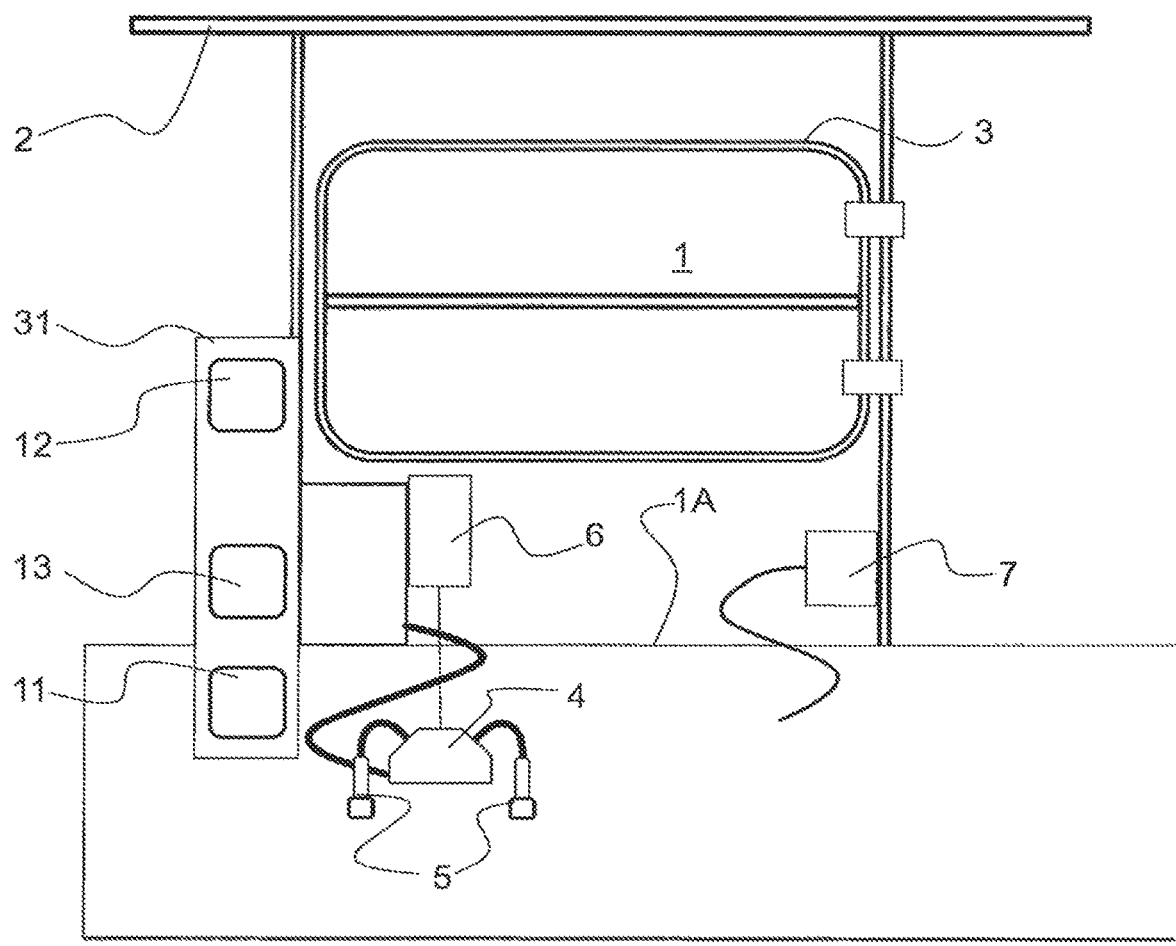
FIG. 2 discloses schematically a rear view of a milking position of the milking plant in FIG. 1.

FIG. 2 discloses one of the milking positions of the milking plant. Each of the milking positions 1 comprises a milking cluster 4 having a plurality of teatcups 5, for instance two or four teatcups 5, to be attached to the teats of the diary animal to be milked. Each milking position 1 may also comprise a retraction device 6 for retracting the milking cluster 4 when the milking operation is finished. Furthermore, each milking position 1 may comprise a spraying device 7 for spraying disinfectant to the teats of the diary animal.

Figure 19:
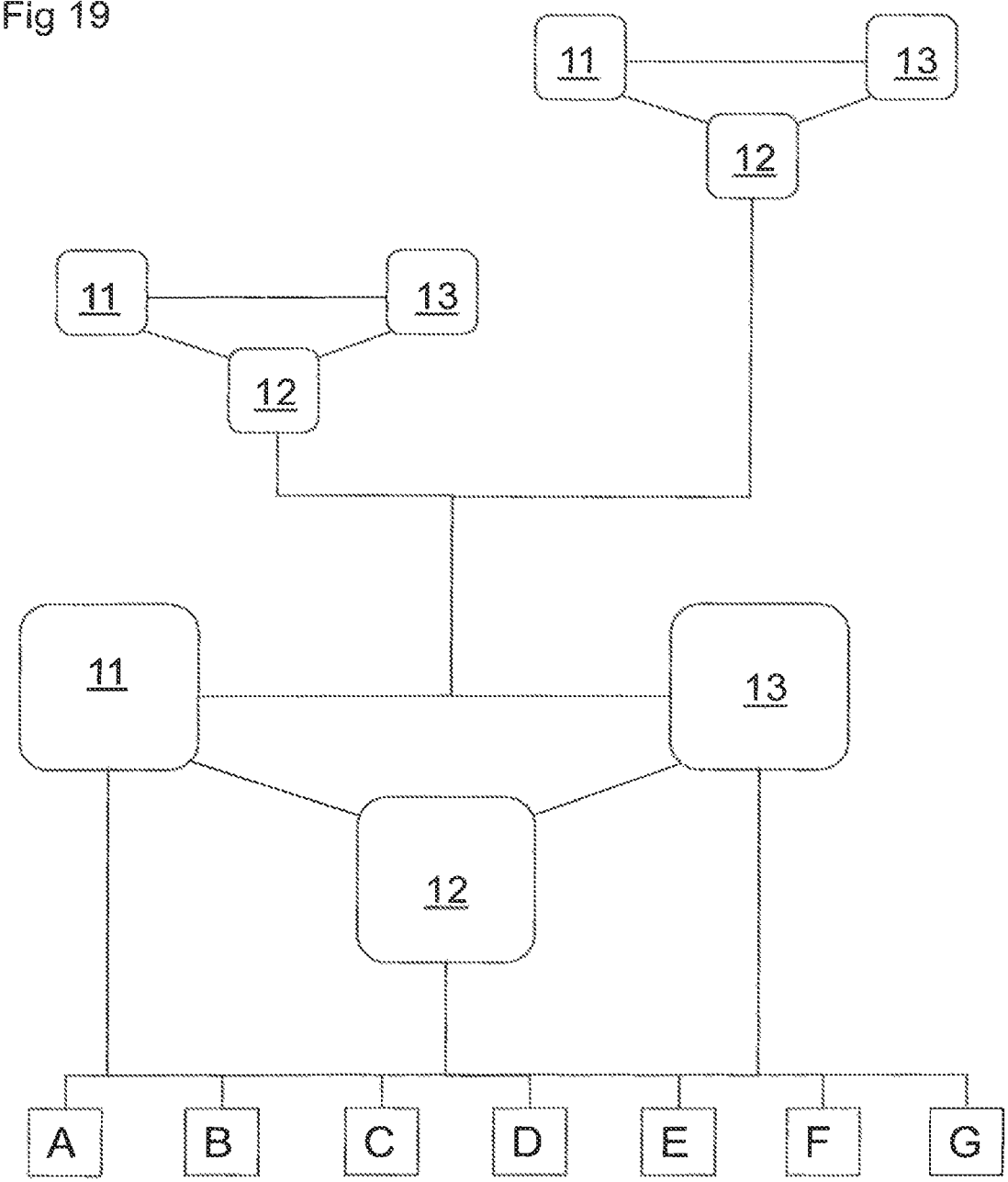
FIG. 19 discloses a diagram of a control arrangement for the milking position and at least a part of the milking plant.

The milking plant comprises a control arrangement forming an overall control system for controlling and supervising various functions A-G of the milking positions 1 of the milking plant, see FIG. 19. The various functions A-G may comprises one or more of the following functions: milk meter supervision A, pulsator rate control and supervision B, vacuum shut-off of milking vacuum C, retraction of milking cluster D, spraying disinfectant E, initiating start of milking operation F, opening and closing of gates G, etc.

In an exemplifying embodiment, the control arrangement comprises a first control module 11, a second control module 12 and a third control module 13. Each of the milking positions 1 may comprise a first control module 11 and a second control module 12, whereas one third control module 13 may be configured for a plurality of milking positions 1.

In said exemplifying embodiment, the first control module 11 is located at a convenient height for the operator below the floor 1A of the milking position 1. The second control module 12 is located at a height facilitating reading of the a display 64, see below.

Figure 8:
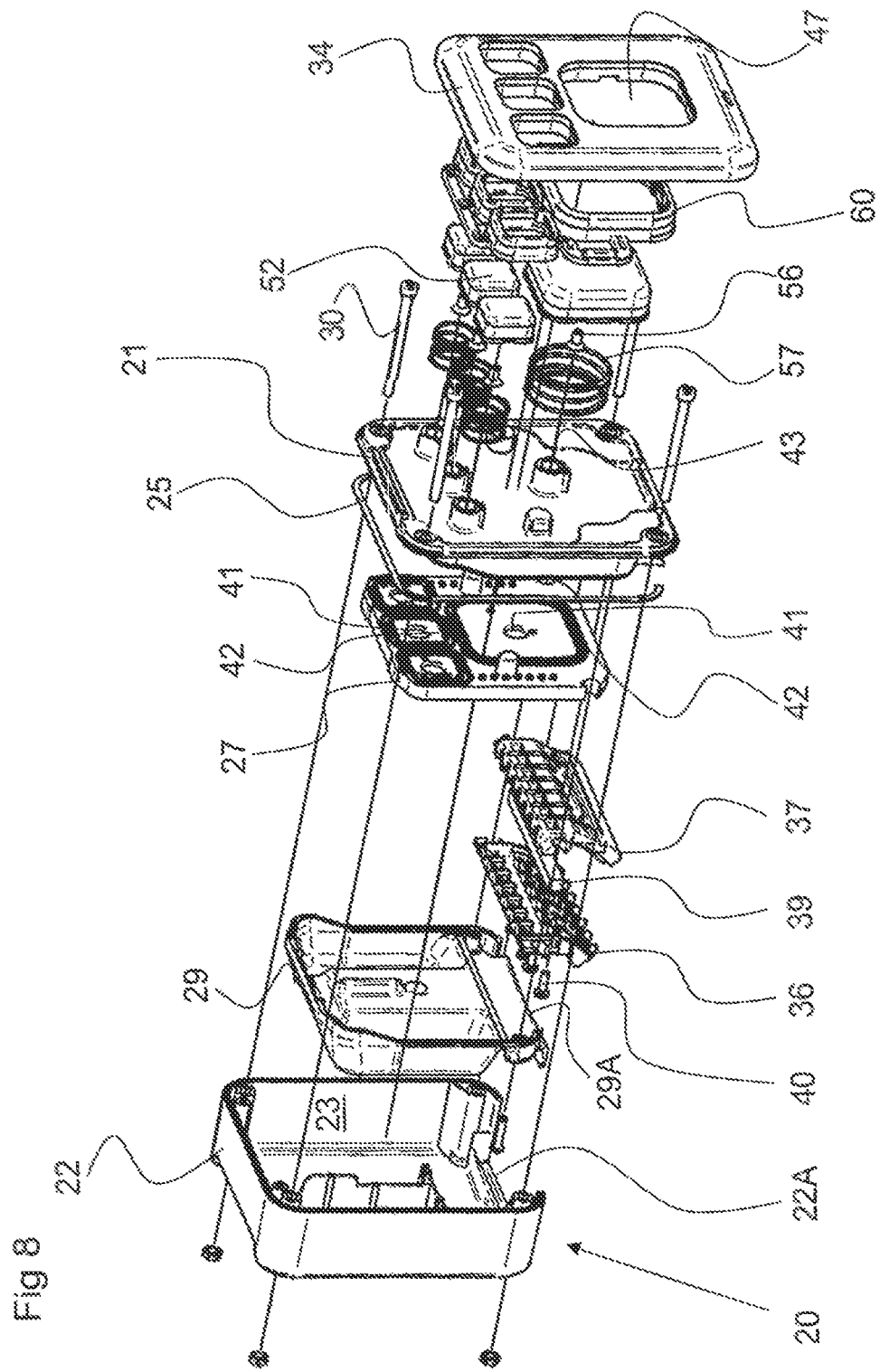
FIG. 8 discloses an exploded perspective view of the first control module in FIG. 3.
Figure 17:
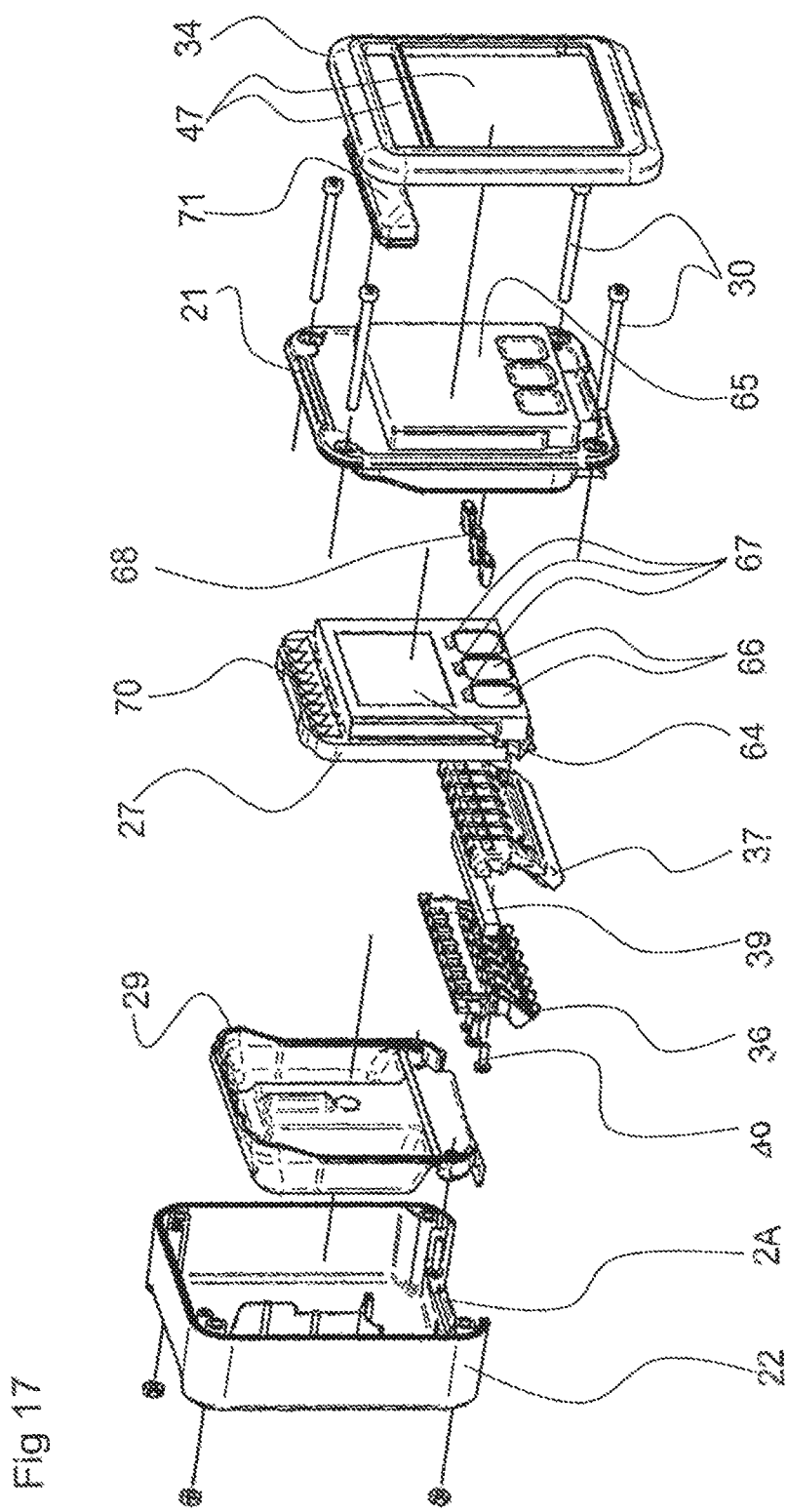
FIG. 17 discloses an exploded perspective view of the second control module in FIG. 11.
Figure 18:
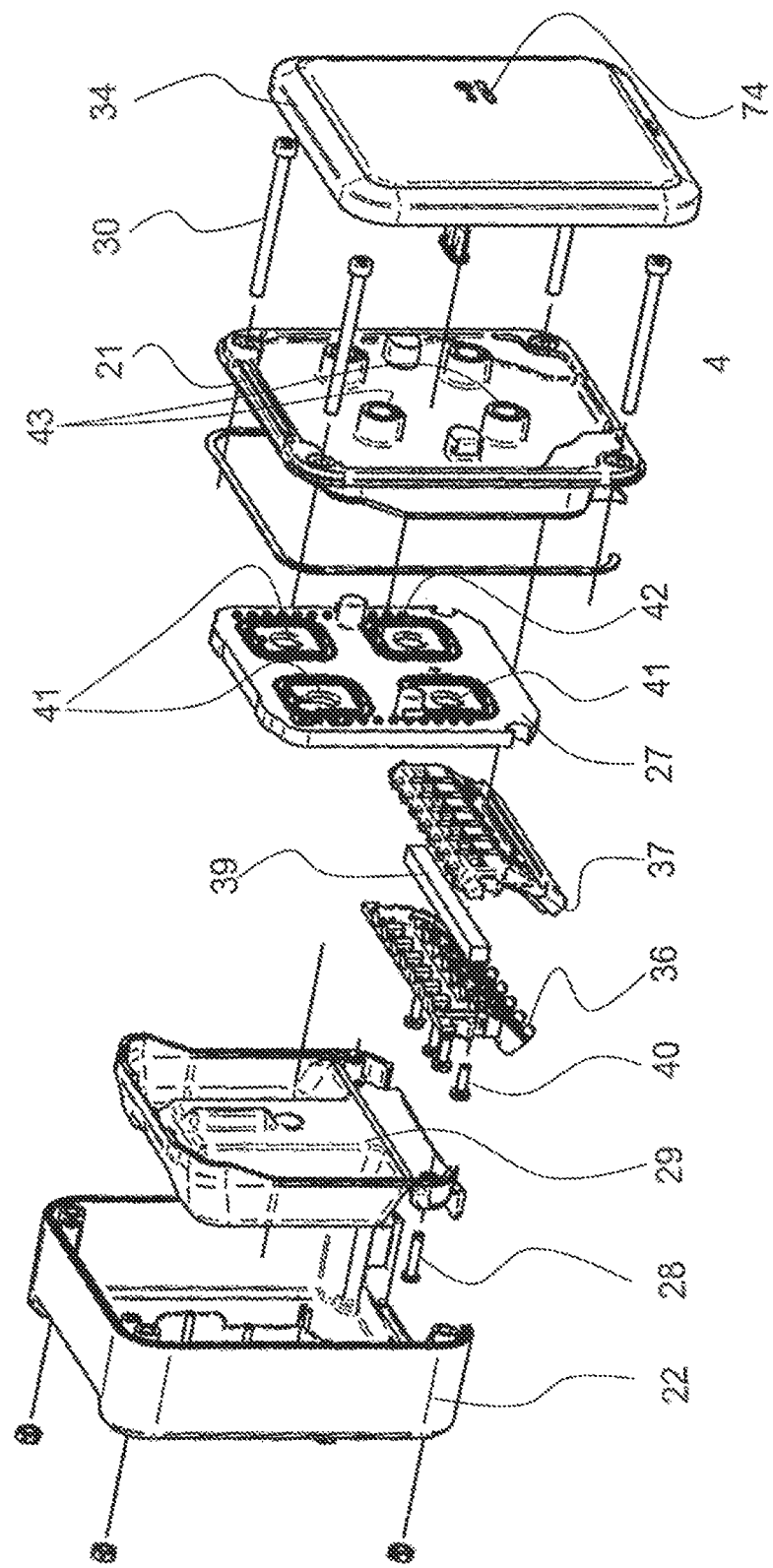
FIG. 18 discloses an exploded perspective view of the third control module in FIG. 3.

With reference to FIGS. 8, 17 and 18, each of the first, second and third control modules 11-13 comprises a casing 20 comprising an inner front plate 21 and an outer rear casing 22. The casing 20 forms an inner space 23 between the inner front plate 21 and the outer rear casing 22. A printed circuit board 24, see FIGS. 6 and 7, is enclosed in the inner space 23. The outer rear casing 22 and the inner front plate 21 are assembled along a respective edge to form the inner space 23. A gasket 25 may be provided between the edges of the outer rear casing 22 and the inner front plate 21.

The printed circuit board 24 incorporates at least a part of the overall control system for controlling and supervising at least some of the functions A-G mentioned above.

The printed circuit board 24 comprises a front side 24A, see FIG. 6, and a rear side 24B, see FIG. 7. Furthermore, the printed circuit board comprises input and output connections 26 extending from the rear side 24B.

The front side 24A of the printed circuit board 24 is attached to a rear side of the inner front plate 21 by means of a transparent adhering substance, such as a transparent glue. Thus, a part of the printed circuit board 24, that is not attached to the inner front plate 21, projects from the rear side of the inner front plate 21.

It should be noted that not the whole surface of the front side 24A of the printed circuit board 24 has to be attached to the rear side of the inner front plate 21. The transparent adhering substance may be applied to certain areas of the front side 24A of the printed circuit board 24.

This part of the printed circuit board 24 that projects from the rear side of the inner front plate 21, is embedded and molded in a block 27 of plastic material, see FIG. 8. The input and output connections 26 extend from the rear side 24A of the printed circuit board 24 through and beyond the block 27 of plastic material. The plastic material may comprise or consist of polyurethane. The printed circuit board 24 may then be fully embedded and enclosed by the plastic material, the transparent adhering substance and the inner front plate 21.

The block 27 of plastic material is enclosed in an inner casing formed by an inner rear casing 29 and the inner front plate 21. The inner rear casing 29 and the inner front plate 21 may be joined to each other by means of screws 28, see FIG. 18. The inner rear casing 29 is enclosed in the casing 20 and provided between the inner front plate 21 and the outer rear casing 22.

The inner front plate 21, with the block 27 of plastic material, the inner rear casing 29 and the outer rear casing 22 are assembled and pressed against each other by means of a number of screws 30 as can be seen in FIGS. 8, 17, 18. The casing 20 may comprise one or more venting holes to permit gases and liquids to escape from the inner space 23 between the inner casing and the casing 20. The venting hole or holes may extend through a downwards directed surface of the outer rear casing 22 and be formed by a recess 22A through this surface, see FIGS. 8, 17, 18.

Figure 11:
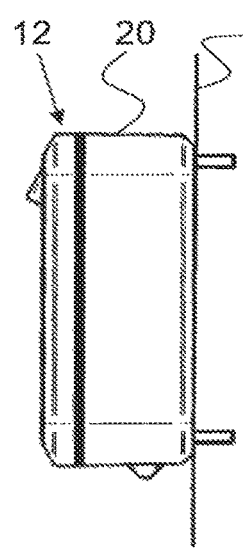
FIG. 11 discloses schematically a side view of a second control module of the control arrangement.
Figure 12:
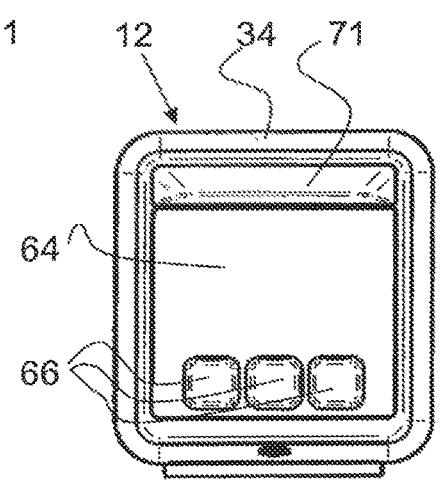
FIG. 12 discloses schematically a front view of the second control module in FIG. 11.
Figure 13:
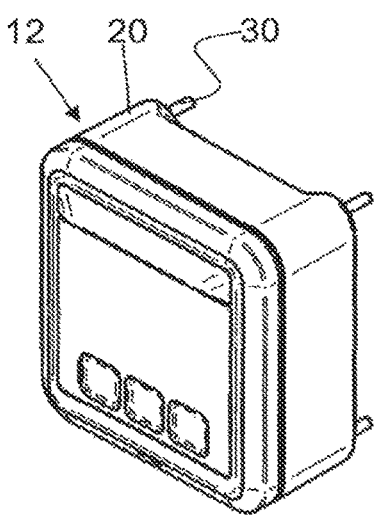
FIG. 13 discloses schematically a perspective view of the second control module in FIG. 11.
Figure 14:
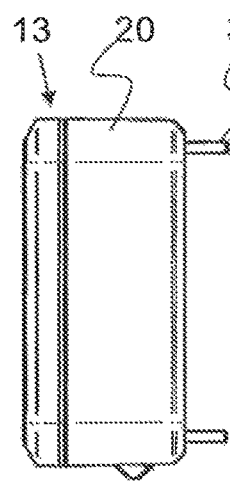
FIG. 14 discloses schematically a side view of a third control module of the control arrangement.
Figure 15:
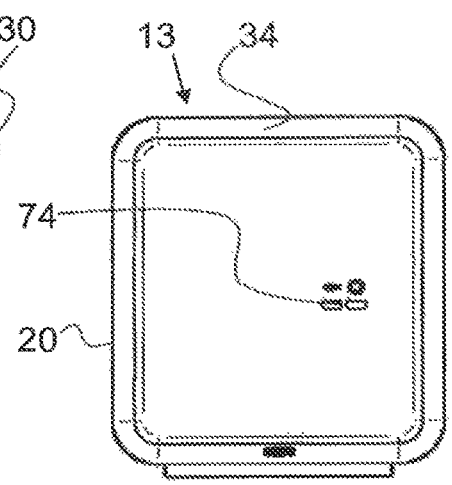
FIG. 15 discloses schematically a front view of the third control module in FIG. 14.
Figure 16:
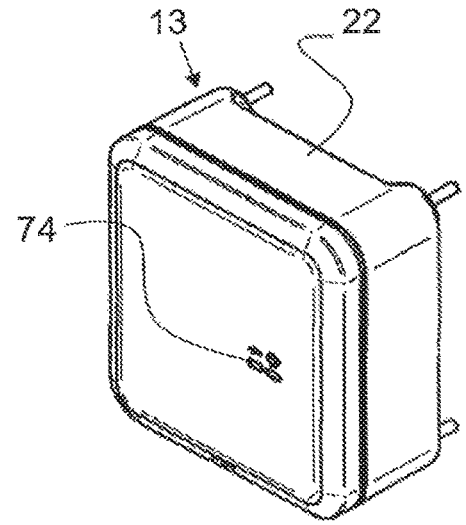
FIG. 16 discloses schematically a perspective view of the third control module in FIG. 14.

The first, second and third control modules 11-13 may be attached to a mounting plate 31, see FIG. 2. The mounting plate 31 may comprise a metal sheet. The casing 20 of the control modules 11-13 may then be attached to the mounting plate 31 by means of the screws 30. The mounting plate 31 may be provided between the inner front plate 21 and the outer rear casing 22 as shown in FIG. 3, or on the rear side of the outer rear casing 22 as shown in FIG. 11. In the first case, the gasket 25 may seal between the inner front plate 21 and the mounting plate 31.

An outer front plate 34 is attached to the inner front plate 21. The outer front plate 34 may be attached to the inner front plate 21 after the inner front plate 21 and the outer rear casing 22 have been assembled. The outer front plate 34 may be releasable to permit easy detachment from the inner front plate 21, irrespective of whether the mounting plate 31 is located between the inner front plate 21 and the outer rear casing 22, or behind the outer rear casing 22.

Electric lines may be provided for connecting the printed circuit board 24 to devices performing said at least some of the functions A-G via the input and output connections 26. The electric lines are grouped in a number of cables 35. In FIG. 4, seven cables 35 are illustrated, but the number cables 35 may be for instance 2, 3, 4, 5, 6, 8, 9 etc. Each of the cables 35 may comprise a great number of electric lines. Alternatively or in addition, wireless communication may be used for communication between the control device and other devices. Wireless communication could, for example, be used as a redundant fallback solution when communication via electric lines fails.

Figure 9:
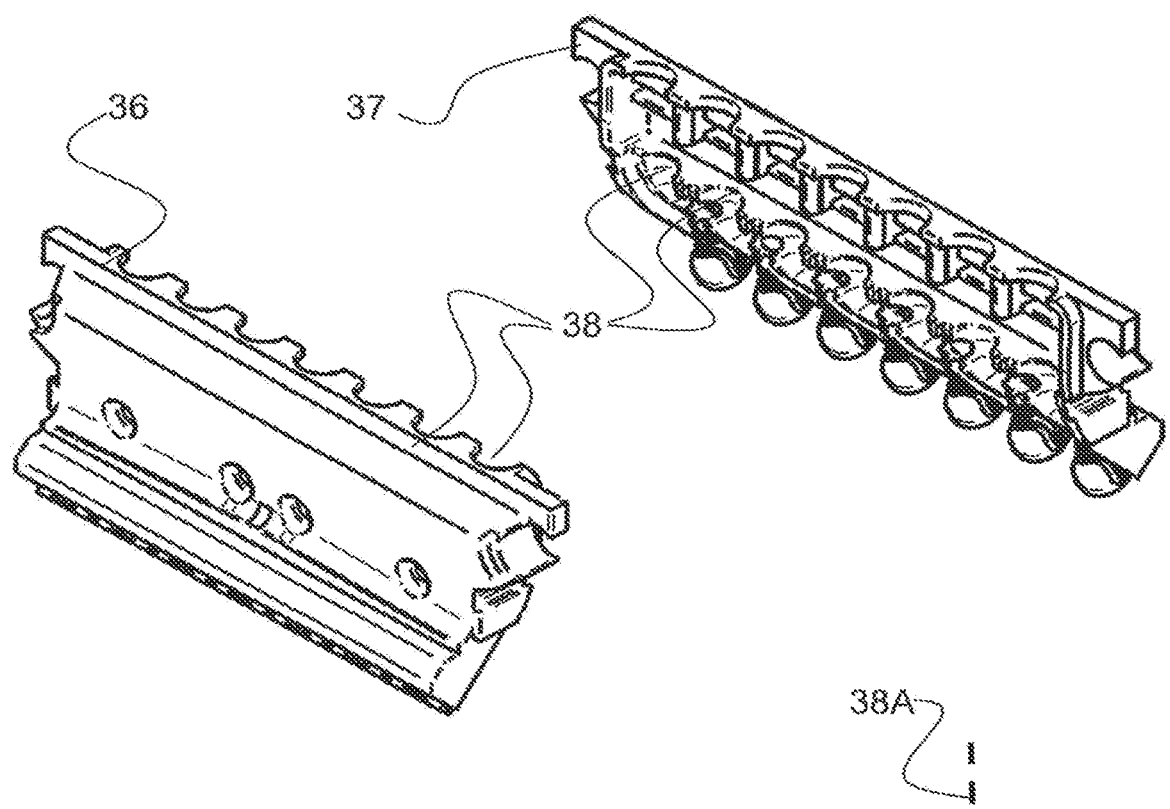
FIG. 9 discloses a first perspective view of a cable clamp of the first control module in FIG. 3.
Figure 10:
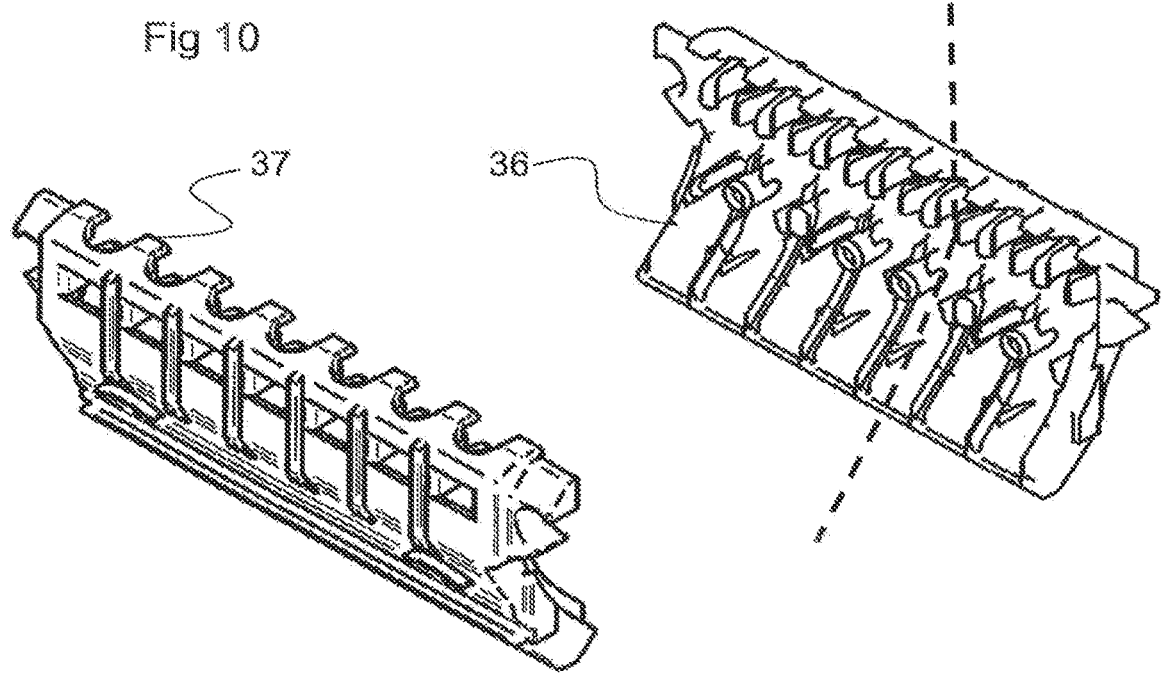
FIG. 10 discloses a second perspective view of the cable clamp in FIG. 9.

A cable clamp is provided in the casing 20. The cable clamp comprises a first clamp part 36 and a second clamp part 37, see FIGS. 9 and 10. The first and second clamp parts 36, 37 form a respective cable channel 38 for each of the seven cables 35. Each of the cable channels 38 may have a curved extension forming a curved path for the respective cable 35, as illustrated by the dashed line 38A in FIG. 10.

The cable clamp is provided between the inner rear casing 28 and the inner front plate 21. A recess 29A may be provided in the inner rear casing 29 in which the cable clamp may be received to permit the cables 35 to pass.

A first seal 39 may be provided between the first clamp part 36 and the cables 35 and a second seal 39 may be provided between the second clamp part 37 and the cables 35. Only one of the seals 39 is illustrated in FIGS. 8, 17 and 18. The cable clamp is assembled by means of a number of screws 40, for instance four screws 40, wherein the cables 35 may be securely and sealingly clamped between the first and second seals 39 between the first clamp part 36 and the second claim part 37. The cable clamp is releasable from the casing 20, in particular from the position between the inner rear casing 28 and the inner front plate 21, which is a great advantage, and makes the installation easier. For example, the cable clamp can be delivered separately with preinstalled cables 35, which are to be connected to the input and output connections 26 when inserting the cable clamp in said position when mounting the control module.

The printed circuit board 24 comprises a number of communication areas provided on the front side 24A of the printed circuit board 24. The communication areas communicate with said at least part of the overall control system mentioned above, and are accessible through the transparent adhering substance. Each of the communication areas comprises a contact surface 41 and a light emitting surface 42. In the first control module 11, the printed circuit board 24 comprises four contact surface 41 and four light emitting surfaces 42. Each of the contact surfaces 41 can be seen as a circle on a front side of the block 27 in FIG. 8, and each of the light emitting surfaces 42 can be seen outside the circle (surrounding the circle at a distance from the same).

The inner front plate 21 and the outer front plate 34 may be configured to permit access to the communication areas through the outer front plate 34 and through the inner front plate 21. Furthermore, the inner front plate 21 and the outer front plate 34 are configured to permit light emitted by the light emitting surface 42 to be visible from outside the casing 20.

The contact surface 41 comprises a capacitive sensor. The inner front plate 21 may comprise a number of apertures 43 each giving access to a respective one the contact surface 41 and the capacitive sensor.

The inner front plate 21 may comprise a number of light guides (not shown). Each light guide may be transparent to the light emitted by the light emitting surface 42 and may be provided opposite to the light emitting surface 42. Alternatively, the whole, or a part of, the inner front plate may be made of a material which is transparent to light.

Each of the light guides (not shown) may surround a respective one of the apertures 43.

Also the outer front plate 34 may comprise at least one opening 47 providing access to the communication area.

The control modules 11-13 may comprise at least one button 50-53, which is accessible from outside the casing 20 and acts on the contact surface 41 the communication area for initiating and/or interrupting at least one of said at least some of the functions via the electric lines.

The first control module 11 comprises four buttons 50-53. A first button 50 may be the button most frequently used by the operator. The button 50 may be pressed for initiating various ones of the functions A-G, for instance initiating the milking operation F, for instance by applying the milking vacuum to the cluster 4 and the teatcups 5, for shutting-off the milking vacuum A, and for initiating retraction of the milking cluster D by the retraction device 6. The three further buttons 51-53 may, for instance, be provided for selecting the function A-G to be initiated and/or interrupted by the first button 50.

The buttons 50-53 extend through a respective one of the openings 47 through the outer front plate 34. Each of the buttons 50-53 comprises a respective activating pin 56 extending through the aperture 43 of the inner front plate 21. When the button 50-53 is pressed, the activating pin 56 is moved to a position close the contact surface 41 to change the capacitance of the capacitive sensor of the contact surface 41, thereby generating a communication signal to said part of the control system.

Each of the buttons 50-53 is biased to an outer rest position by means of a respective spring 57. The spring may be provided between the button 50-53 and the inner front plate 21, and surround the aperture 43, as can be seen in FIG. 8.

The outer front plate 34 comprises a number of light zones 60 that may be provided in or surround a respective one of the openings 47. The light zones 60 are provided opposite to a respective one of the light emitting surfaces 42 and, when applicable, light guides (not shown) of the inner front plate 21. The light zones 60 are transparent to the light emitted by the light emitting surface 42, and thus the light emitted by the light emitting surface 42 of the printed circuit board 24 may be guided through the transparent adhering substance, the light guide/inner front plate 21 and the light zone 60 to be visible to the operator.

Each of the light emitting surfaces 42 may be formed by one or more underlying LED-lights, which may be configured to generate various lights depending on the signal to be transferred to the operator. The lights may cover various colors, fixed light, flashing lights, circulating lights, lights moving back and forth etc.

The control modules 11-13 may also comprise a display 64 for displaying a state of some of the functions.

The second control module 12, see FIGS. 11-13 and 17, comprises a display 64. The display 64 is visible from outside the casing 20. The display 64 is connected to the contact surface 41 of the communication area of the printed circuit board 24.

As can be seen in FIG. 17, the display 64 may be attached to the front side of the printed circuit board 24 and may be seen through a window 65 of the inner front plate 21. The window 65 may be provided in an aperture 43 through the inner front plate 21.

The display 64 is visible through an opening 47 through the outer front plate 34, and may extend through the opening 47.

Three buttons 66 may be incorporated in association with the display 64. The three buttons 66 comprises a respective touch sensitive button. Each of the buttons 66 may be provided for controlling the various states to be displayed on the display 64, and/or to control certain functions related to milking, preferably functions not already controlled by a first control module 11. The button 66 may be accessible through the window 65.

The buttons 66 may be connected to one or more of the contact surfaces 41 of the printed circuit board 24. An additional printed circuit board (not disclosed) may be provided for the control of the buttons 66, wherein the additional printed circuit board communicates with the printed circuit board 24, possibly via one or more of the contact surfaces 41.

Light to and through the buttons 66 may be provided by three light emitting members 67 incorporated in association with the display 64 and the buttons 66. The light may be guided to the respective button 66 via a light guide 68.

In addition, the second control module 12 comprises a warning light provided above the display 64. The warning light comprises a row of LED lights 70 extending from the printed circuit board 24. The LED lights 70 are visible through the inner front plate 21 and through the outer front plate 34. A light directing member 71 is provided outside the LED light 70 and extends through an opening 47 through the outer front plate 34.

One exemplifying embodiment of the third control module 13, see FIGS. 14-16 and 18, differs from the first and second control modules 11 and 12 in that no buttons and no display are provided. This example of a third control module 13 is thus intended to operate without any interaction with the operator of the milking plant.

However, the outer front plate 34 is detachable for permitting access to the capacitive sensor of the respective contact surface 41 of the printed circuit board 24 via a respective aperture 43 through the inner front plate 21 in order to permit programming of the printed circuit board 24.

The third control module 13 may function as a router, or a link, between the other control modules 11, 12 and higher layers, such as a herd management system.

If the function of a third control module 13 fails, the first and second control modules 11, 12 may instead communicate wirelessly with the herd management system, possibly via each other. This redundancy in the communication system is a great strength. Wireless communication is not considered as reliable as wired communication in the environment where the control modules 11-13 are to be mounted, but may be a good safety precaution.

Another embodiment of a third control module may comprise four equally sized buttons, e.g. symmetrically located over the front surface. Such an example of a third control module may be configured for controlling some of the functions A-G, for instance controlling the function of opening and closing of gates G. The buttons may be implemented in a similar manner as in the first or second control module.

At least one light emitting surface 42 may be provided on the printed circuit board 24 and configured to emit light to indicate that the third control module 13 is operating. The light of the light emitting surface 42 may be guided through a light guide (not shown) provided in the inner front plate 21 opposite to the light emitting surface 42. As before, the inner front plate 21 may alternatively be completely or partly made of a transparent material. The light guide may surround one of the aperture 43.

The outer front plate 34 may comprise a window 74 opposite to the light guide on the inner front plate 21 in order to permit the operator to see the light emitted by the light emitting surface 42.

The printed circuit board 24 of the first control module 11 may incorporate at least a first part of the control system for controlling and supervising at least some of the functions A-G.

The printed circuit board 24 of the second control module 12 may incorporate at least a second part of the control system for controlling and supervising at least some of the functions A-G.

The printed circuit board 24 of the third control module 13 may incorporate at least a third part of the control system for controlling and supervising at least some of the functions A-G.

Thanks to the three control modules 11, 12 and 13, the flexibility of the overall control arrangement may be improved. In each individual milking position 1, the farmer may choose to install one or more control modules 11-13 in the milking position 1 depending on the control and supervising needs. For instance, each milking position 1 of a particular milking plant may be provided with only the first control module 11, which may be sufficient for controlling and supervising the functions of this particular milking plant. At a later point in time, the farmer may decide to add functionality by further installing a second control unit 12 in each milking position 1, and thereby e.g. access valuable information in real time via the display.

In another case, each milking position may comprise a first control module 11 and a second control module 12, or a first control module 11 and a third control module 13, or a second control module 12 and a third control module 13. However, the types of third control module mainly described herein are intended to serve a plurality of milking positions 1.

It is also possible to have different number of control modules in the different milking positions 1 of the milking plant. For instance, each milking position 1 may comprise a first control module 11 and a second control module 12, whereas the third control module 13 may be configured to operate together with a number of milking positions 1.

With more than one control module 11-13, it is possible to transfer the duties of a control module 11-13 that is defect or out of service for any other reason to the other control modules. Such a transfer of duties may take place in an automatic manner, and is indicated by the lines connecting the control modules 11-13 in FIG. 19 to each other.

FIG. 19 also illustrates that the control system of one milking place 1, may communicate with the control system of other milking positions 1 of the milking plant. If the control system of one milking position 1 is not operating properly one or more of the functions A-G may be performed by the control system of any other milking position 1.

Consequently, the first part of the control system operated by the first control module 11, the second part of the control system operated by the second control module 12, and the third part of the control system operated by the third control module 13 may be overlapping, or at least partly overlapping. Thus, the first part of the control system, the second part of the control system and the third part of the control system may cover, or at least partly cover, the same functions A-G of the milking plant.

In particular, the first part of the control system, the second part of the control system and the third part of the control system may be identical, or substantially identical. For reasons of production economy, several parts of the different control modules 11-13 may be identical. Even the printed circuit boards 24 may be identical, comprising all functions necessary for the functions of all three control modules 11-13, but only using the parts necessary for the relevant control module 11-13 in which it is mounted The invention is not limited to the embodiments disclosed, but may be varied and modified within the scope of the following claims.

The invention claimed is:

1. A control module for controlling and supervising various functions of a milking position for milking a dairy animal, the control module comprising:
    a printed circuit board that incorporates at least a part of a controller configured to control and supervise at least some of the various functions, the printed circuit board comprising
    input and output connections connecting the printed circuit board to devices performing at least some of the functions by electric lines,
    a front side on which at least one communication area is provided, the at least one communication area communicating with said part of the controller, and
    a rear side; and
    a casing forming an inner space enclosing the printed circuit board, the casing comprising an inner front plate,
    wherein the front side of the printed circuit board is attached to a rear side of the inner front plate by a transparent adhering substance so that at least a part of the printed circuit board projects from the rear side of the inner front plate, the communication area being accessible through the inner front plate, said part of the printed circuit board being embedded in a block of plastic material.

2. The control module according to claim 1, wherein the input and output connections extend from the printed circuit board through and beyond the block of plastic material.

3. The control module according to claim 1, wherein the communication area comprises:
    a contact surface configured to receive contact, and
    a light emitting surface configured to emit light visible from outside the casing.

4. The control module according to claim 3, further comprising at least one button accessible from outside the casing, the at least one button being configured to act on the contact surface of the communication area to one or more of initiate and interrupt at least one of the at least some of the functions.

5. The control module according to claim 3, further comprising a display visible from outside the casing, the display being connected to the contact surface of the communication area to display a state of some of the functions.

6. The control module according to claim 3, wherein the inner front plate is transparent to the light emitted by the light emitting surface at least in a position opposite to the light emitting surface.

7. The control module according to claim 3, wherein the inner front plate comprises an aperture configured to provide access to the contact surface.

8. The control module according to according to claim 7, further comprising a light guide transparent to the light emitted by the light emitting surface, the light guide surrounding the aperture.

9. The control module according to claim 1, wherein the block of plastic material is enclosed in an inner plastic material casing formed by an inner rear casing and the inner front plate, the inner rear casing being enclosed in the casing.

10. The control module according to claim 9, wherein a cable clamp is provided between the inner rear casing and the inner front plate.

11. The control module according to claim 1, wherein an outer front plate is attached to the inner front plate, the outer front plate comprising at least one opening configured to provide access to the communication area.

12. The control module according to claim 11, wherein the button extends through the at least one opening, and
wherein the outer front plate comprises a light zone that surrounds the at least one opening, the light zone being transparent to the light emitted by the light emitting surface, the light zone being provided opposite to the light emitting surface.

13. The control module according to claim 1, wherein the control module is configured to receive electric lines grouped in at least two cables.

14. The control module according to claim 13, wherein a cable clamp is provided in the casing, the cable clamp comprising a first clamp part and a second clamp part, the first and second clamp parts forming a respective cable channel for each of said at least two cables.

15. The control module according to claim 14, wherein each of the cable channels has a curved extension forming a curved path for the respective cable.

16. A control arrangement forming a control system configured to control and supervise various functions of a milking plant incorporating a plurality of milking positions for milking a respective dairy animal, the control arrangement comprising:
a respective first control module for each of the milking positions, the first control module being configured to control and supervise the various functions of a milking position of the plurality of milking position for milking the respective dairy animal, the first control module comprising:
a printed circuit board that incorporates at least a part of a controller configured to control and supervise at least some of the various functions, the printed circuit board comprising:
input and output connections connecting the printed circuit board to devices performing at least some of the functions by electric lines,
a front side on which at least one communication area is provided, the at least one communication area communicating with said part of the controller, and
a rear side, and
a casing forming an inner space enclosing the printed circuit board, the casing comprising an inner front plate,
wherein the front side of the printed circuit board of the first control module is attached to a rear side of the inner front plate of the first control module by a first transparent adhering substance so that at least a part of the printed circuit board of the first control module projects from the rear side of the inner front plate of the first control module, the communication area of the first control module being accessible through the inner front plate of the first control module, said part of the printed circuit board of the first control module being embedded in a first block of plastic material, and
the printed circuit board of the first control module incorporates at least a first part of the control system configured to control and supervise at least some of the functions.

17. The control arrangement according to claim 16, further comprising:
a respective second control module for each of the milking positions, the second control module being configured to control and supervise the various functions of a milking position of the plurality of milking position for milking the respective dairy animal, the second control module comprising:
a printed circuit board that incorporates at least a part of a controller configured to control and supervise at least some of the various functions, the printed circuit board comprising:
input and output connections connecting the printed circuit board to devices performing at least some of the functions by electric lines,
a front side on which at least one communication area is provided, the at least one communication area communicating with said part of the controller, and
a rear side, and
a casing forming an inner space enclosing the printed circuit board, the casing comprising an inner front plate,
wherein the front side of the printed circuit board of the second control module is attached to a rear side of the inner front plate of the second control module by a second transparent adhering substance so that at least a part of the printed circuit board of the second control module projects from the rear side of the inner front plate of the second control module, the communication area of the second control module being accessible through the inner front plate of the second control module, said part of the printed circuit board of the second control module being embedded in a second block of plastic material, and
wherein the printed circuit board of the second control module incorporates at least a second part of the control system configured to control and supervise at least some of the functions.

18. The control arrangement according to claim 17, wherein the first part of the control system and the second part of the control system are overlapping or at least partly overlapping with respect to one another, and
wherein the first part of the control system and the second part of the control system at least partly cover the same functions.

19. The control arrangement according to claim 17, further comprising:
a respective third control module for each of the milking positions, the third control module being configured to control and supervise the various functions of a milking position of the plurality of milking position for milking the respective dairy animal, the third control module comprising:
a printed circuit board that incorporates at least a part of a controller configured to control and supervise at least some of the various functions, the printed circuit board comprising:
input and output connections connecting the printed circuit board to devices performing at least some of the functions by electric lines,
a front side on which at least one communication area is provided, the at least one communication area communicating with said part of the controller, and
a rear side, and
a casing forming an inner space enclosing the printed circuit board, the casing comprising an inner front plate,
wherein the front side of the printed circuit board of the third control module is attached to a rear side of the inner front plate of the third control module by a third transparent adhering substance so that at least a part of the printed circuit board of the third control module projects from the rear side of the inner front plate of the third control module, the communication area of the third control module being accessible through the inner front plate of the third control module, said part of the printed circuit board of the third control module being embedded in a third block of plastic material, and wherein the printed circuit board of the third control module incorporates at least a third part of the control system configured to control and supervise at least some of the functions.

20. The control arrangement according to claim 19, wherein the first part of the control system, the second part of the control system, and the third part of the control system are overlapping or at least partly overlapping with respect to one another, and wherein the first part of the control system, the second part of the control system, and the third part of the control system at least partly cover the same functions.

21. A control module for controlling and supervising various functions of a milking position for milking a dairy animal, the controller comprising:

a printed circuit board that incorporates at least a part of a controller configured to control and supervise at least some of the various functions, the printed circuit board comprising:
  input and output connections, the printed circuit board being connectable to devices performing at least some of the functions via the input and output connections by electric lines,
  a front side, at least one communication area being provided on the front side of the printed circuit board, the at least one communication area communicating with said part of the controller, and
  a rear side; and
a casing forming an inner space enclosing the printed circuit board, the casing comprising an inner front plate,
wherein the front side of the printed circuit board is attached to a rear side of the inner front plate and at least a part of the printed circuit board projects from the rear side of the inner front plate, the communication area being accessible through the inner front plate, said part of the printed circuit board being embedded in a block of plastic material.

* * * * *